United States Patent
Chien et al.

(10) Patent No.: US 8,232,154 B2
(45) Date of Patent: Jul. 31, 2012

(54) METHOD FOR FABRICATING SEMICONDUCTOR DEVICE

(75) Inventors: Chin-Cheng Chien, Tainan County (TW); Chun-Hsien Lin, Tainan County (TW); Chiu-Hsien Yeh, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 389 days.

(21) Appl. No.: 12/563,388

(22) Filed: Sep. 21, 2009

(65) Prior Publication Data

US 2011/0070702 A1    Mar. 24, 2011

(51) Int. Cl.
*H01L 21/8238* (2006.01)

(52) U.S. Cl. ........ 438/199; 438/216; 438/585; 438/591; 257/368; 257/E21.295; 257/E21.632

(58) Field of Classification Search ................ None
See application file for complete search history.

(56) References Cited

U.S. PATENT DOCUMENTS

| | | | |
|---|---|---|---|
| 7,109,079 B2 | 9/2006 | Schaeffer, III et al. | |
| 7,816,243 B2 | 10/2010 | Chuang et al. | |
| 8,003,507 B2* | 8/2011 | Chen et al. | 438/592 |
| 2010/0038721 A1* | 2/2010 | Lin et al. | 257/369 |
| 2010/0041223 A1* | 2/2010 | Chen et al. | 438/591 |
| 2010/0048011 A1* | 2/2010 | Yeh et al. | 438/591 |
| 2010/0052063 A1* | 3/2010 | Masuoka et al. | 257/369 |
| 2010/0197128 A1* | 8/2010 | Schaeffer et al. | 438/591 |
| 2011/0042728 A1* | 2/2011 | Cheng et al. | 257/288 |

* cited by examiner

*Primary Examiner* — Zandra Smith
*Assistant Examiner* — Khanh Duong
(74) *Attorney, Agent, or Firm* — WPAT, PC; Justin King (57) ABSTRACT

A method for fabricating a semiconductor device is provided. A high dielectric constant (high-k) layer and a work function metal layer are formed in sequence on a substrate. A hard mask layer is formed on the work function metal layer, where the material of the hard mask layer is lanthanum oxide. The work function metal layer is patterned by using the hard mask layer as a mask. The hard mask layer is then removed. Afterwards, a gate structure is formed on the substrate.

13 Claims, 6 Drawing Sheets

METHOD FOR FABRICATING SEMICONDUCTOR DEVICE

BACKGROUND OF THE INVENTION

1. Field of the Invention

The invention relates to a method of fabricating a semiconductor device. More particularly, the invention relates to a method of fabricating a metal oxide semiconductor (MOS) device.

2. Description of Related Art

With the continual miniaturization of semiconductor devices, dimensions of gate structures are also gradually reduced. Therefore, the thickness of gate dielectric layers also needs to be reduced to prevent the performance of the devices from being affected. Generally, the material of the gate dielectric layers usually includes silicon oxide. However, the leakage current phenomenon frequently occurs when reducing the thickness of the gate dielectric layers adopting silicon oxide. In order to reduce the occurrence of leakage current, a conventional method is to replace silicon oxide with high dielectric constant (high k) material for the gate dielectric layers. When applying high dielectric constant material as the gate dielectric layers, the gates adopting polysilicon then react with high dielectric constant material to generate Fermi-level pinning, thereby resulting in an increase in the threshold voltage so as to affect the performance of the device. In one of the conventional techniques, the metal layer is applied as the gate, that is, the work function metal layer known in the art, to prevent the threshold voltage from increasing and therefore reducing the resistance of the device.

In general, when fabricating metal gates of a complementary metal oxide semiconductor (CMOS) device, a dual metal gate process is usually applied. By adopting metal materials of different work functions to fabricate the N-type channel metal oxide semiconductor (NMOS) device and the P-type channel metal oxide semiconductor (PMOS) device, the NMOS transistor and the PMOS transistor then have different threshold voltages and electrical properties respectively.

In a conventional metal gate structure, the current method is to utilize polysilicon material as a hard mask layer to pattern the metal materials required by the NMOS region and the PMOS region respectively. Here, the patterned metal material remaining in the NMOS region has the work function different from that in the PMOS region. In details, when lanthanum oxide (LaO) is used as the metal material determining the work function, a polysilicon hard mask layer is first formed on a LaO layer, and the polysilicon hard mask layer is then used as a mask to remove the LaO layer exposed.

However, when forming the polysilicon hard mask layer, the deposition of polysilicon material is usually carried out in a high temperature process, so that the thermal budget of the process usually becomes too high. Moreover, after multiple times of the high temperature process for forming the polysilicon hard mask layer, the LaO material diffuses into the high dielectric constant layer and causes problems such as leakage current and the like, thereby affecting the electrical property of the device strongly. In addition, LaO easily diffuses into the polysilicon hard mask layer and therefore reacts with polysilicon material when the temperature of the process becomes too high. Therefore, not only is the LaO etching incomplete when patterning the LaO layer, but problems such as troublesome removal of polysilicon material in the subsequent process of removing the polysilicon hard mask layer also result, so as to affect the reliability and performance of the device.

SUMMARY OF THE INVENTION

Accordingly, the invention provides a method of fabricating a semiconductor device, and this method adopts lanthanum oxide (LaO) as a material of a hard mask layer.

The invention provides a method of fabricating a semiconductor device. Firstly, a high dielectric constant layer and a work function metal layer are formed in sequence on a substrate. A hard mask layer is formed on the work function metal layer, where a material of the hard mask layer is LaO. The work function metal layer is patterned by using the hard mask layer as a mask. Then, the hard mask layer is removed. Afterwards, a gate structure is foamed on the substrate.

According to an embodiment of the invention, the method of forming the work function metal layer, for example, includes forming a cap layer on a high dielectric constant layer and then forming a metal layer on the cap layer. The material of the cap layer is selected from the group consisting of $Al_2O_3$, $Ga_2O_3$, $In_2O_3$, $Ti_2O_3$, $La_2O_3$, $Dy_2O_3$, $Y_2O_3$, $MgO_2$, and an oxide of an element in the lanthanide series, for instance. The material of the metal layer is selected from the group consisting of TiN, TaN, TaC, TaCNO, TaCN, and $TiAl_x$, for example.

According to an embodiment of the invention, before the high dielectric constant layer is formed, an insulation layer is further formed on the substrate.

The invention provides another method of fabricating a semiconductor device. Firstly, a substrate having a first region and a second region disposed separately is provided. A gate dielectric layer and a first work function metal layer are formed in sequence on the substrate. A first hard mask layer is formed on the first work function metal layer in the first region, and the material of the first hard mask layer is LaO. Thereafter, the first work function metal layer in the second region is removed by using the first hard mask layer as a mask. Later, a second work function metal layer is formed on the substrate and a second hard mask layer is formed on the second work function metal layer in the second region. Moreover, the material of the second hard mask layer is LaO. The second work function metal layer in the first region is removed by using the second hard mask layer as a mask. Subsequently, the second hard mask layer is removed.

According to an embodiment of the invention, before the second work function metal layer is formed, the method further includes removing the first hard mask layer.

According to an embodiment of the invention, the second work function metal layer covers the first hard mask layer. When removing the second hard mask layer, the first hard mask layer is removed simultaneously, for example.

According to an embodiment of the invention, the method of forming the first work function metal layer, for example, includes forming a first cap layer on a gate dielectric layer in the first region and the second region, and then forming a first metal layer on the first cap layer.

According to an embodiment of the invention, the method of forming the second work function metal layer, for example, includes forming a second cap layer on the first work function metal layer in the first region and on the gate dielectric layer in the second region, and then forming a second metal layer on the second cap layer.

According to an embodiment of the invention, when the first region is a P-type metal oxide semiconductor (PMOS) region and the second region is an N-type metal oxide semiconductor (NMOS) region, the material of the first cap layer is aluminum oxide and the material of the second cap layer is LaO. When removing the second hard mask layer, the second cap layer in the first region is removed simultaneously, for example.

According to an embodiment of the invention, when the first region is an NMOS region and the second region is a PMOS region, the material of the first cap layer is LaO and the material of the second cap layer is aluminum oxide.

According to an embodiment of the invention, the method of forming the gate dielectric layer, for instance, includes forming an insulation layer on the substrate and then forming a high dielectric constant layer on the insulation layer.

According to an embodiment of the invention, the method of fabricating the semiconductor device further includes the following steps. After a conductive layer is formed on the first work function metal layer and the second work function metal layer, the conductive layer, the first work function metal layer, the second work function metal layer, and the gate dielectric layer are patterned so as to form a first gate structure in the first region and a second gate structure in the second region. A first source/drain region is formed in the substrate at respective sides of the first gate structure, and a second source/drain region is formed in the substrate at respective sides of the second gate structure. After the first gate structure and the second gate structure are formed and before the first source/drain region and the second source/drain region are formed, a spacer can be further formed on each sidewall of the first gate structure and the second gate structure. After the first source/drain region and the second source/drain region are formed, a stress layer can be further formed on the substrate to cover the first gate structure and the second gate structure.

In light of the foregoing, in the invention, LaO is adopted as the material of the hard mask layer, so as to facilitate in reducing the thermal budget in the process. In addition, problems strongly affecting electrical property such as leakage current caused by the diffusion of the metal materials of the work function metal layer into the high dielectric constant layer after multiple times of high temperature process can be prevented. Furthermore, when the material of the hard mask layer of the invention is LaO, the work function metal layer exposed can be removed entirely when patterning the work function metal layer. Additionally, the material of the hard mask layer will not remain after the process of removing the hard mask layer.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1F are cross-sectional views schematically illustrating a process for fabricating a semiconductor device according to an embodiment of the invention. It should be noted that the method of fabricating the semiconductor device described in the following adopts a complementary metal oxide semiconductor (CMOS) process for illustration. People skilled in the art should be able to embody the invention based on the illustration, whereas the scope of the invention is not limited thereto. Moreover, the materials, the manners and the sequence of formation of other components such as metal gate structures, doped regions, spacers, stress layers, and the like are all fabricated based on techniques known to people skilled in the art, and are not limited to the descriptions in the following embodiments.

Figure 1A:
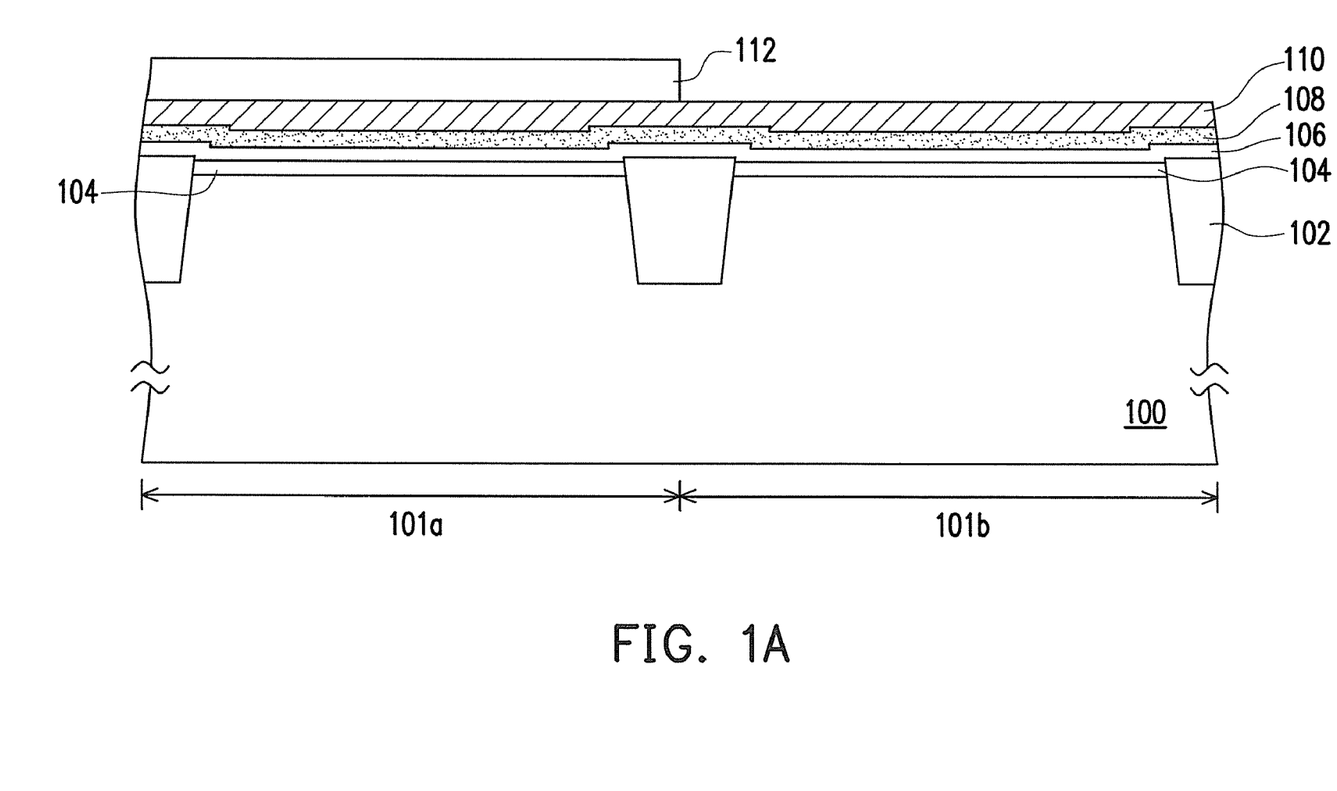
FIGS. 1A through 1F are cross-sectional views schematically illustrating a process for fabricating a semiconductor device according to an embodiment of the invention.

Referring to FIG. 1A, a substrate 100 is provided. The substrate 100, for example, is a semiconductor substrate such as an N-type or a P-type silicon substrate, a group III-V semiconductor substrate, and the like. The substrate 100 includes a first region 101a and a second region 101b. The first region 101a and the second region 101b are spaced by isolation structures 102. In one embodiment, the first region 101a is a P-type metal oxide semiconductor (PMOS) region and the second region 101b is an N-type metal oxide semiconductor (NMOS) region. The isolation structures 102 are shallow trench isolation structures, for example.

Thereafter, a high dielectric constant (high-k) layer 106 is formed on the substrate 100. The high dielectric constant layer 106 is made of, for example, a dielectric material with a dielectric constant greater than 4, such as TiN, $TiO_2$, $HfO_2$, $ZrO_2$, $Al_2O_3$, AlN, $La_2O_3$, $Y_2O_3$, $Gd_2O_3$, $Ta_2O_5$, or a combination thereof. The high dielectric constant layer 106 is fabricated by a chemical vapor deposition (CVD) process, for instance. In one embodiment, before the high dielectric constant material layer 106 is formed, an insulation layer 104 is also optionally formed on a surface of the substrate 100 to increase an adhesion between the high dielectric constant layer 106 and the substrate 100. The insulation layer 104 is made of silicon oxide, and formed by, for example, thermal oxidation. The high dielectric constant layer 106 and the insulation layer 104 are adopted jointly as a material of a gate dielectric layer in a gate structure to be subsequently formed, for example.

Afterwards, a cap layer 108 and a metal layer 110 are formed on the high dielectric constant layer 106 in sequence. The cap layer 108 is made of metal oxide, such as $Al_2O_3$, $Ga_2O_3$, $In_2O_3$, $Ti_2O_3$, or a combination thereof. The cap layer 108 is formed by the CVD process or an atomic layer deposition (ALD) process, for example. The metal layer 110 is made of, for example, TiN, TaN, TaC, TaCNO, TaCN, $TiAl_x$, or a combination thereof, and formed by the CVD process or a physical vapor deposition (PVD) process, for instance.

Subsequently, a hard mask layer 112 is formed on the metal layer 110 in the first region 101a. The hard mask layer 112 is made of $La_2O_3$. In the formation of the hard mask layer 112, for example, a hard mask material layer (not illustrated) is first formed on the metal layer 110 in the first region 101a and the second region 101b. Next, a patterned photoresist layer (not illustrated) is formed on the hard mask material layer in the first region 101a. The patterned photoresist layer is then used as a mask to remove the hard mask material layer in the second region 101b. Thereafter, the patterned photoresist layer is removed.

Figure 1B:
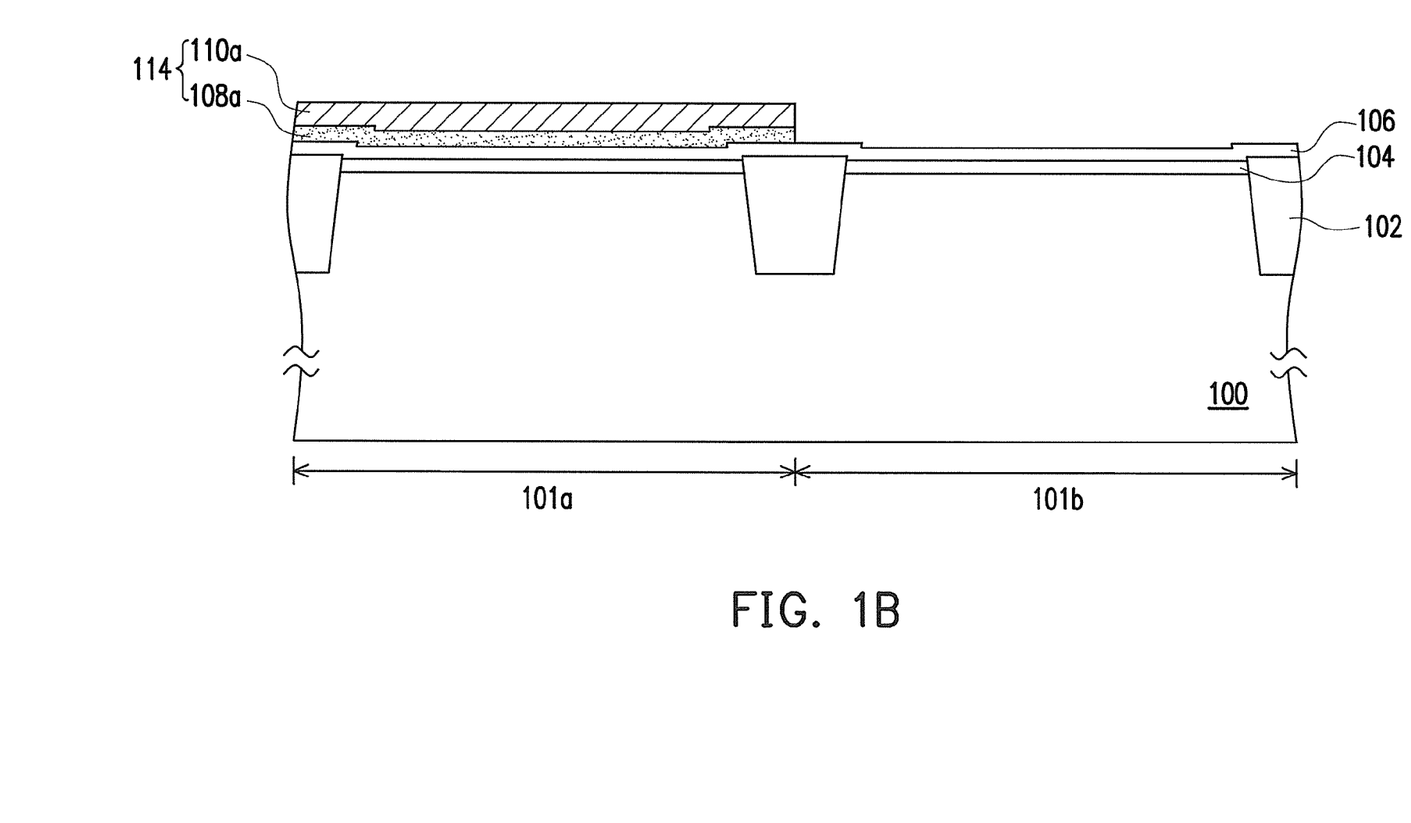

Referring to FIG. 1B, the hard mask layer 112 is used as a mask, and the metal layer 110 and the cap layer 108 in the second region 101b are removed to expose the high dielectric constant layer 106 in the second region 101b. Moreover, a work function metal layer 114 is formed on the high dielectric constant layer 106 in the first region 101a. The work function metal layer 114 includes a cap layer 108a and a metal layer 110a. The metal layer 110 and the cap layer 108 not covered by the hard mask layer 112 are removed by performing a wet etching process, which uses ammonia hydrogen peroxide mixture (APM) as an etchant, for example. Later, the hard mask layer 112 in the first region 101a is optionally removed to expose the metal layer 110a in the first region 101a. The hard mask layer 112 is removed, for instance, by using the wet etching process adopting diluted hydrochloric acid (DHCl) as the etchant.

Figure 1C:
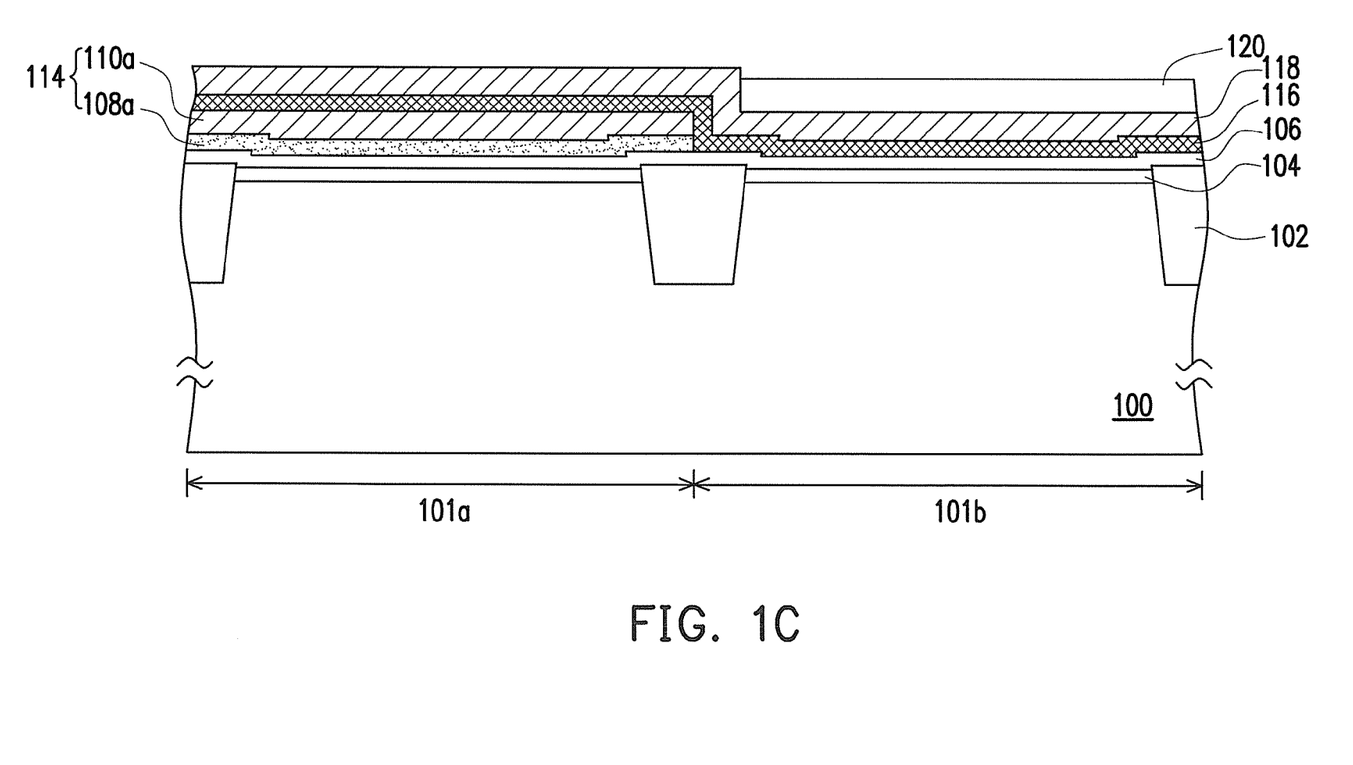

Referring to FIG. 1C, a cap layer 116 and a metal layer 118 are formed on the substrate 110 in sequence. The cap layer 116 covers the metal layer 110a in the first region 101a and covers the high dielectric constant layer 106 in the second region 101b. In another embodiment, after the work function metal layer 114 is formed and before the cap layer 116 is formed, the hard mask layer 112 may be not removed. Alternatively, the cap layer 116 covers the hard mask layer 112 in the first region 101a and the high dielectric constant layer 106 in the second region 101b. The cap layer 116 is a metal oxide layer, for instance, made of $La_2O_3$, $Dy_2O_3$, $Y_2O_3$, $MgO_2$, an oxide of an element in the lanthanum series, or a combination thereof. The cap layer 116 is framed by the CVD process or the ALD process, for example. The metal layer 118 is made of, for example, TiN, TaN, TaC, TaCNO, TaCN, $TiAl_x$, or a combination thereof, and formed by the CVD process or the PVD process, for instance.

Thereafter, a hard mask layer 120 is formed on the metal layer 118 in the second region 101b. The hard mask layer 120 is made of $La_2O_3$. In the formation of the hard mask layer 120, for example, a hard mask material layer (not illustrated) is first formed on the metal layer 118 in the first region 101a and the second region 101b. Next, a patterned photoresist layer (not illustrated) is formed on the hard mask material layer in the second region 101b. The patterned photoresist layer is then used as a mask to remove the hard mask material layer in the first region 101a. Thereafter, the patterned photoresist layer is removed.

Figure 1D:
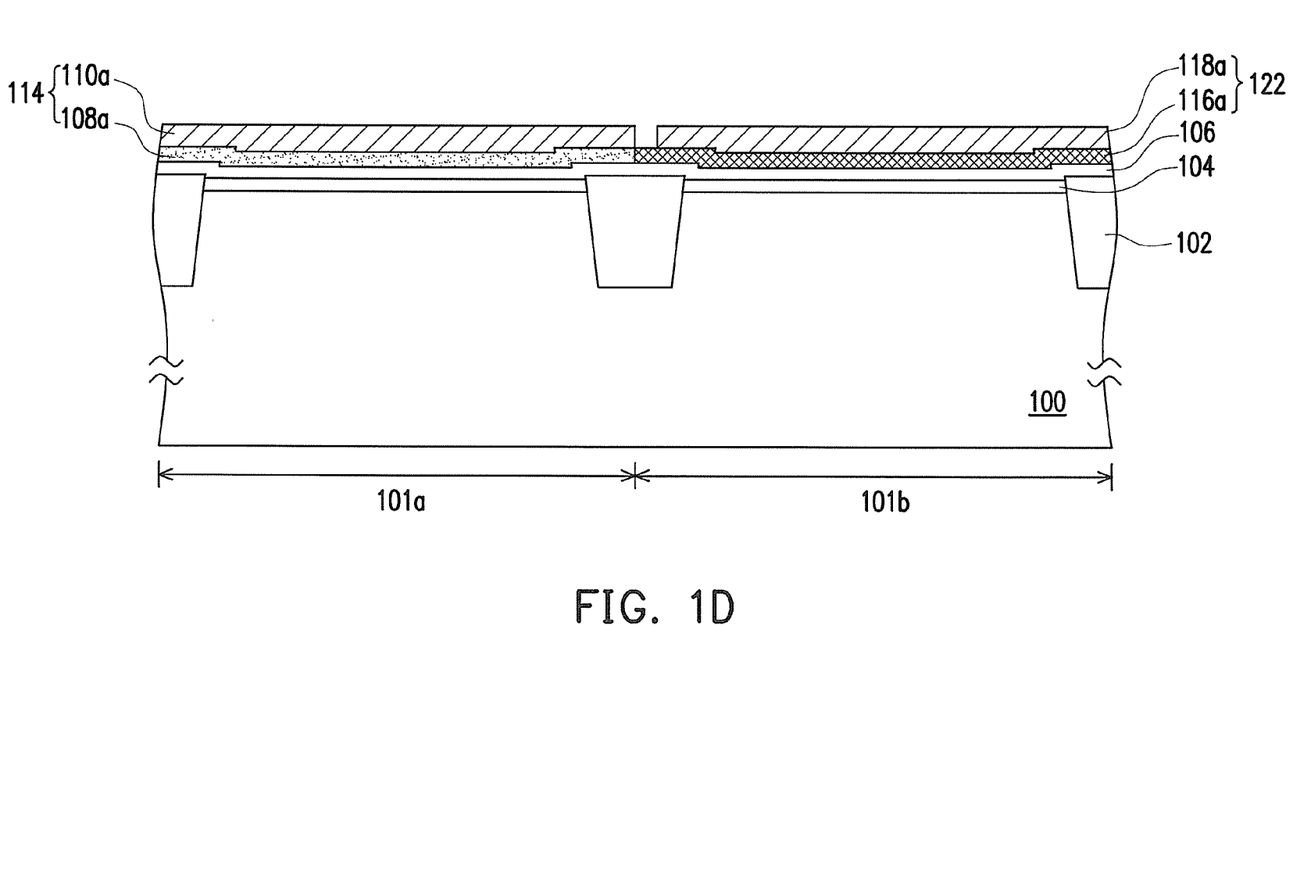

Referring to FIG. 1D, the hard mask layer 120 is used as a mask to remove the metal layer 118 in the first region 101a, and the cap layer 116 in the first region 101a is thus exposed. The metal layer 118 not covered by the hard mask layer 120 is removed by using the wet etching process, which adopts APM as the etchant, for example. Further, the hard mask layer 120 is removed to expose the metal layer 118a in the second region 101b. It should be noted that when the materials of the cap layer 116 and the hard mask layer 120 have the same etching selectivity, that is, when the materials of the cap layer 116 and the hard mask layer 120 are both, for example, $La_2O_3$, the cap layer 116 in the first region 101a is removed while the hard mask layer 120 in the second region 101b is being removed, thereby exposing the metal layer 110a in the first region 101a. Hence, after the cap layer 116 in the first region 101a and the hard mask layer 120 in the second region 101b are removed simultaneously, a work function metal layer 122 is formed on the high dielectric constant layer 106 in the second region 101b. Here, the work function metal layer 122 includes a cap layer 116a and a metal layer 118a. In this embodiment, the metal layers 110a and 118a are spaced in-between, and thus do not overlap each other. The cap layer 116 in the first region 101a and the hard mask layer 120 in the second region 101b are removed, for instance, by using the wet etching process adopting DHCl as the etchant.

Additionally, in another embodiment, when the materials of the cap layer 116 and the hard mask layer 120 have different etching selectivities, after the hard mask layer 120 is formed, the hard mask layer 120 can also be used as a mask to pattern the metal layer 118 and the cap layer 116 in the first region 101a, thereby exposing the metal layer 110a in the first region 101a. Afterwards, the hard mask layer 120 is removed, so as to form the work function metal layer 122 including the cap layer 116a and the metal layer 118a in the second region 101b.

It should be illustrated that in the aforementioned embodiments, steps shown in FIGS. 1A to 1D adopt $La_2O_3$ as the material of the hard mask layer. Furthermore, the hard mask layer 112 is first used as a mask to pattern the metal layer 110 and the cap layer 108 so as to form the work function metal layer 114 on the high dielectric constant layer 106 in the first region 101a (e.g. PMOS region). The hard mask layer 120 is then used as a mask to pattern the metal layer 118 and the cap layer 116 so as to form in the work function metal layer 122 on the high dielectric constant layer 106 in the second region 101b (e.g. NMOS region). Generally, the work function value required by the PMOS transistor is approximately from 4.9 eV to 5.1 eV, and the work function value required by the NMOS transistor is approximately from 4.0 eV to 4.2 eV. In the first region 101a, the work function of a gate structure to be subsequently formed is determined by the work function metal layer 114 including the metal layer 110a and the cap layer 108a underneath. In the second region 101b, the work function of a gate structure to be subsequently formed is determined by the work function metal layer 122 including the metal layer 118a and the cap layer 116a underneath. Therefore, the work function values respectively required by the PMOS transistor and the NMOS transistor can be achieved by adjusting the materials and the thickness of the metal layers 110 and 118 and the cap layers 108 and 116.

Figure 1E:
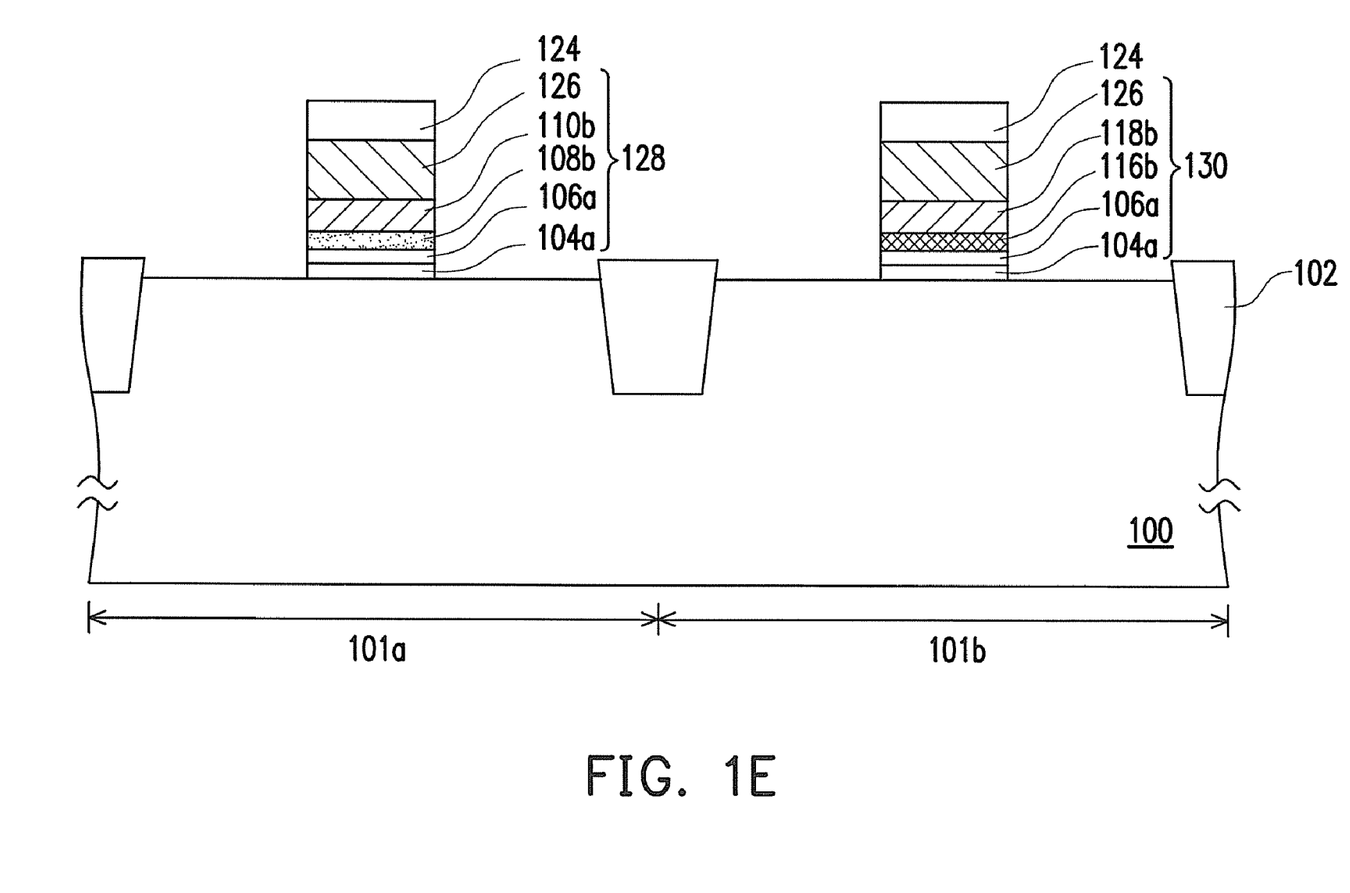

Thereafter, referring to FIG. 1E, a conductive layer and a patterned mask layer 124 are formed on the metal layers 110a and 118a. The conductive layer is made of polysilicon, and formed by the CVD process, for example. The patterned mask layer 124 is made of for example, silicon oxide, silicon nitride, silicon oxynitride, or materials having etching selectivities different from those of the layers underneath. Moreover, the patterned mask layer 124 is formed by the CVD process, for instance. Subsequently, the conductive layer, the metal layer 110a, the metal layer 118a, the cap layer 108a, the cap layer 116a, the high dielectric constant layer 106, and the insulation layer 104 are patterned so as to form a gate structure 128 in the first region 101a and a gate structure 130 in the second region 101b. The patterning can be implemented by using the patterned mask layer 124 as a mask to perform the etching process so as to define the gate structures 128 and 130. The gate structure 128 includes a conductive layer 126, the metal layer 110b, the cap layer 108b, the high dielectric constant layer 106a, and the insulation layer 104a. The gate structure 130 includes the conductive layer 126, the metal layer 118b, the cap layer 116b, the high dielectric constant layer 106a, and the insulation layer 104a.

Figure 1F:
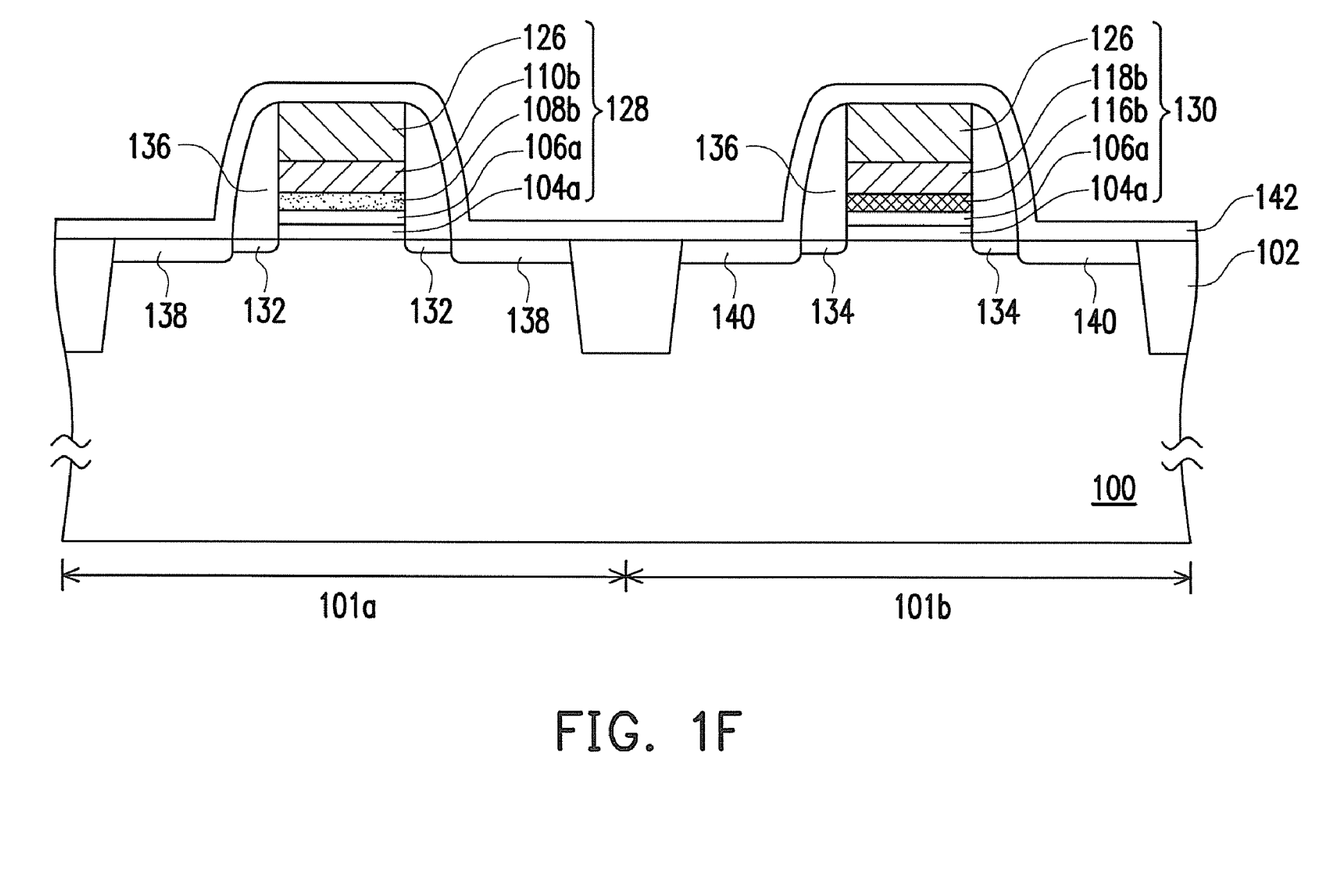

Referring to FIG. 1F, the patterned mask layer 124 is removed and the fabrication of the metal gate structures is carried out continually. In details, the gate structures 128 and 130 are used as masks to perform an ion implantation process, so as to form lightly-doped regions 132 in the substrate 100 at respective sides of the gate structure 128 and form lightly-doped regions 134 in the substrate 100 at respective sides of the gate structure 130. The lightly-doped regions 132 and 134 serve as source/drain extension regions. When the first region 101a is the PMOS region, the lightly-doped regions 132 are P-type lightly-doped regions. When the second region 101b is the NMOS region, the lightly-doped regions 134 are N-type lightly-doped regions. Then, a spacer 136 is formed on each sidewall of the gate structures 128 and 130. The spacers 136 are made of silicon oxide, silicon nitride, or silicon oxynitride, for example. In the method of forming the spacers 136, for example, a layer of spacer material (not illustrated) covering the gate structures 128 and 130 is first formed on the substrate 100 by the CVD process, and a portion of the spacer material layer is then removed by an anisotropic etching process. In addition, although the spacers 136 are merely illustrated with single-layer structures in FIG. 1F, the spacers 136 can also have multi-layer spacer structures.

Then, the gate structures 128 and 130 and the spacers 136 are used as masks to form source/drain regions 138 in the substrate 100 at the respective sides of the gate structure 128 and form in source/drain regions 140 in the substrate 100 at the respective sides of the gate structure 130. When the first region 101a is the PMOS region, the source/drain regions 138 are P-type heavily-doped region or SiGe epitaxial layers, for example. When the second region 101b is the NMOS region, the source/drain regions 140 are N-type heavily-doped region, for instance. In one embodiment, the source/drain regions 138 and 140 are formed by the ion implantation process, for example, so as to form the P-type or the N-type heavily-doped regions respectively in the substrate 100. In another embodiment, in the formation of the source/drain regions 138, a portion of the substrate 100 at the respective sides of the gate structures 128 is first removed to form trenches (not shown), for example. Subsequently, a selective epitaxy growth (SEG) process is performed to form the SiGe epitaxial layers in the trenches. The SiGe epitaxial layers are not only used as the source/region regions of the PMOS transistor, but also increases compressive stress of a channel of the PMOS transistor, so that mobility of holes increases, thereby enhancing operation speed and performance of the PMOS transistor. Later, a stress layer 142 is optionally formed on the substrate 100 to cover the first region 101a and the second region 101b entirely. The stress layer 142 is made of silicon nitride, and formed by performing the CVD process, for example. In one embodiment, the stress layer 142 provides compressive stress or tensile stress to the channel region. Moreover, the stress layer 142 is capable of generating the tensile stress suitable for the channel of the NMOS transistor or the compressive stress suitable for the channel of the PMOS transistor by changing process parameters in the formation of the stress layer 142.

It should be noted that the hard mask layers made of $La_2O_3$ are utilized in the embodiments of the invention to pattern the metal layers and the cap layers of the PMOS transistor and the NMOS transistor, so as to form metal gate structures having the required work function metal layers respectively. Thus, by adopting $La_2O_3$ in the hard mask layers, the thermal budget of the process is reduced. Moreover, the metal materials of the cap layers are further prevented from diffusing into the high dielectric constant layer after multiple times of the high temperature process, which, in turn, strongly affects the electrical property of the device. Additionally, adopting $La_2O_3$ in the hard mask layers further avoids problems such as incomplete removal of the hard mask layers which resulted from the polysilicon material used as the hard mask layer reacting with neighboring metal-containing layers.

It should be noted that in the embodiments aforementioned, the PMOS region is illustrated by the first region 101a and the NMOS region is illustrated by the second region 101b. Further, the work function metal layer in the PMOS region is first formed, and the work function metal layer in the NMOS region is then formed. However, the invention is not limited thereto. People skilled in the art should understand that in another embodiment of the invention, the first region 101a is used as the NMOS region and the second region is used as the PMOS region, so that the work function metal layer in the NMOS region is first formed and the work function metal layer in the PMOS region is formed subsequently.

In the following, cross-sectional views illustrated in FIGS. 1A to 1D are utilized to illustrate another embodiment of the invention in detail.

In another embodiment, such as the process illustrated in FIG. 1A and FIG. 1B, when the first region 101a is the NMOS region and the second region 101b is the PMOS region, the cap layer 108 and the metal layer 110 in the first region 101a faun the work function metal layer 114 of the NMOS transistor after patterning. Since the work function of the NMOS transistor is determined by the work function metal layer 114 and the work function value is approximately from 4.0 eV to 4.2 eV, the cap layer 108 and the metal layer 110 are therefore the materials capable of achieving the work function required by the NMOS transistor, for example. The cap layer 108 is made of metal oxide, for instance, $La_2O_3$, $Dy_2O_3$, $Y_2O_3$, $MgO_2$, an oxide of an element in the lanthanum series, or a combination thereof. The metal layer 110 is made of TiN, TaN, TaC, TaCNO, TaCN, $TiAl_x$, or a combination thereof, for example.

Thereafter, in the process illustrated in FIG. 1C and FIG. 1D, when the first region 101a is the NMOS region and the second region 101b is the PMOS region, the cap layer 116 and the metal layer 118 in the second region 101b form the work function metal layer 122 of the PMOS transistor after patterning Since the work function of the PMOS transistor is determined by the work function metal layer 122 and the work function value is approximately from 4.9 eV to 5.1 eV, the cap layer 116 and the metal layer 118 are therefore the materials capable of achieving the work function required by the PMOS transistor, for example. The cap layer 116 is made of metal oxide, such as $Al_2O_3$, $Ga_2O_3$, $In_2O_3$, $Ti_2O_3$, or a combination thereof The metal layer 118 is made of TiN, TaN, TaC, TaCNO, TaCN, $TiAl_x$, or a combination thereof, for example.

Subsequently, the gate structure 128 is formed in the first region 101a and the gate structure 130 is formed in the second region 10 1b. People skilled in the art should be able to apply the invention and make modifications according to the embodiments above-mentioned, and the details are thus not illustrated herein. It should be noted that when the first region 101a is the NMOS region, the lightly-doped regions 132 are the N-type lightly-doped regions and the source/drain regions 138 are the N-type heavily-doped regions, for instance. When the second region 101b is the PMOS region, the lightly-doped regions 134 are the P-type lightly-doped regions and the source/drain regions 140 are the P-type heavily-doped regions or SiGe epitaxial layers, for example.

In summary, the method of fabricating the semiconductor device of the invention has at least the following advantages:

1. The method of fabricating the semiconductor device in the embodiments aforementioned facilitates in reducing the thermal budget of the fabricating process.

2. The method of fabricating the semiconductor device in the embodiments aforementioned prevents problems strongly affecting electrical property, such as leakage current and the like, which resulted when the metal materials diffuse into the high dielectric constant layer.

3. The method of fabricating the semiconductor device in the embodiments aforementioned does not result in metal residual and can easily remove the hard mask layers completely during the patterning of the work function metal layer.

4. The method of fabricating the semiconductor device in the embodiments aforementioned can be applied in the formation of metal gates, especially in the formation of the CMOS device, and can be integrated with the existing semiconductor process. The process aforementioned is not only simple, but can also improve the reliability and performance of the device effectively.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a semiconductor device, comprising:
    providing a substrate, having a first region and a second region disposed separately;
    forming a gate dielectric layer and a first work function metal layer in sequence on the substrate;
    forming a first hard mask layer on the first work function metal layer in the first region, wherein the first hard mask layer comprises lanthanum oxide;
    removing the first work function metal layer in the second region by using the first hard mask layer as a mask;
    forming a second work function metal layer on the substrate, wherein the second work function metal layer covers the first hard mask layer;
    forming a second hard mask layer on the second work function metal layer in the second region, wherein the second hard mask layer comprises lanthanum oxide;
    removing the second work function metal layer in the first region by using the second hard mask layer as a mask; and
    removing the second hard mask layer.

2. The method of fabricating the semiconductor device as claimed in claim 1, wherein the first hard mask layer is removed while the second hard mask layer is being removed.

3. The method of fabricating the semiconductor device as claimed in claim 1, wherein the step of forming the first work function metal layer comprises:
    forming a first cap layer on the gate dielectric layer in the first region and the second region; and
    forming a first metal layer on the first cap layer.

4. The method of fabricating the semiconductor device as claimed in claim 3, wherein the first metal layer comprises a material selected from the group consisting of TiN, TaN, TaC, TaCNO, TaCN, and TiAl$_x$.

5. The method of fabricating the semiconductor device as claimed in claim 3, wherein the step of forming the second work function metal layer comprises:
    forming a second cap layer on the first work function metal layer in the first region and on the gate dielectric layer in the second region; and
    forming a second metal layer on the second cap layer.

6. The method of fabricating the semiconductor device as claimed in claim 5, wherein the second metal layer comprises a material selected from the group consisting of TiN, TaN, TaC, TaCNO, TaCN, and TiAl$_x$.

7. The method of fabricating the semiconductor device as claimed in claim 5, wherein when the first region is a P-type metal oxide semiconductor region and the second region is an N-type metal oxide semiconductor region, the first cap layer comprises aluminum oxide and the second cap layer comprises lanthanum oxide.

8. The method of fabricating the semiconductor device as claimed in claim 7, wherein the second cap layer in the first region is removed while the second hard mask layer is being removed.

9. The method of fabricating the semiconductor device as claimed in claim 5, wherein when the first region is an N-type metal oxide semiconductor region and the second region is a P-type metal oxide semiconductor region, the first cap layer comprises lanthanum oxide and the second cap layer comprises aluminum oxide.

10. The method of fabricating the semiconductor device as claimed in claim 1, wherein the step of forming the gate dielectric layer comprises:
    forming an insulation layer on the substrate; and
    forming a high dielectric constant layer on the insulation layer.

11. The method of fabricating the semiconductor device as claimed in claim 1, further comprising:
    forming a conductive layer on the first work function metal layer and the second work function metal layer;
    patterning the conductive layer, the first work function metal layer, the second work function metal layer, and the gate dielectric layer, so as to form a first gate structure in the first region and a second gate structure in the second region; and
    forming a first source/drain region in the substrate at respective sides of the first gate structure, and forming a second source/drain region in the substrate at respective sides of the second gate structure.

12. The method of fabricating the semiconductor device as claimed in claim 11, after forming the first gate structure and the second gate structure and before forming the first source/drain region and the second source/drain region, further comprising forming a spacer on each sidewall of the first gate structure and the second gate structure respectively.

13. The method of fabricating the semiconductor device as claimed in claim 11, wherein after forming the first source/drain region and the second source/drain region, the method further comprises forming a stress layer on the substrate to cover the first gate structure and the second gate structure.

* * * * *